(12) United States Patent
Pan

(10) Patent No.: US 7,071,858 B2
(45) Date of Patent: Jul. 4, 2006

(54) METHOD AND SYSTEM FOR A GLITCH-FREE DIFFERENTIAL CURRENT STEERING SWITCH CIRCUIT FOR HIGH SPEED, HIGH RESOLUTION DIGITAL-TO-ANALOG CONVERSION

(75) Inventor: Hui Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/169,665

(22) Filed: Jun. 30, 2005

(65) Prior Publication Data

US 2006/0092062 A1 May 4, 2006

Related U.S. Application Data

(60) Provisional application No. 60/622,936, filed on Oct. 29, 2004.

(51) Int. Cl.
*H03M 1/00* (2006.01)

(52) U.S. Cl. ............ 341/133; 341/136; 341/144; 341/153; 341/154; 327/359; 330/252; 330/253

(58) Field of Classification Search ............ 341/133, 341/136, 144, 153–154; 327/359; 330/252–254, 330/261
See application file for complete search history.

(56) References Cited

U.S. PATENT DOCUMENTS

| 4,494,075 | A | * | 1/1985 | Yoshihisa et al. ............ 330/254 |
| 4,728,900 | A | * | 3/1988 | Nakagawara et al. ....... 330/253 |
| 4,896,157 | A | * | 1/1990 | Mijuskovic .................. 341/144 |
| 5,552,742 | A | * | 9/1996 | Perkins ........................ 327/563 |
| 5,764,101 | A | * | 6/1998 | Archer ........................ 330/253 |
| 5,859,559 | A | * | 1/1999 | Hong et al. .................. 327/359 |
| 6,420,932 | B1 | * | 7/2002 | Casper ........................ 330/258 |
| 6,621,432 | B1 | * | 9/2003 | Ganci .......................... 341/136 |
| 2003/0038740 | A1 | * | 2/2003 | Mulder et al. .............. 341/144 |
| 2003/0080889 | A1 | | 5/2003 | Lee et al. .................... 341/144 |

OTHER PUBLICATIONS

Abstract for Japanese Patent Appl. No. 11326655, 1 page, no date.
European Search Report, dated Dec. 16, 2005, for European Patent Appl. No. 05021146.5, 4 pages.

* cited by examiner

*Primary Examiner*—Rexford Barnie
*Assistant Examiner*—Khai Nguyen
(74) *Attorney, Agent, or Firm*—Sterne, Kessler, Goldstein & Fox, P.L.L.C.

(57) ABSTRACT

Provided are a method and system for reducing glitch in a switch circuit. A system includes a current-steering switch circuit including a main differential pair switch coupled to a first tail current having a first current value. Also included is an auxiliary differential pair switch connected to the main differential pair switch. The auxiliary differential pair switch is coupled to a second tail current and configured to substantially reduce a feed-through current associated with the main differential pair switch.

20 Claims, 7 Drawing Sheets

METHOD AND SYSTEM FOR A
GLITCH-FREE DIFFERENTIAL CURRENT
STEERING SWITCH CIRCUIT FOR HIGH
SPEED, HIGH RESOLUTION
DIGITAL-TO-ANALOG CONVERSION

CROSS-REFERENCE TO RELATED
APPLICATIONS

This application claims the benefit of U.S. Provisional Application Ser. No. 60/622,936, filed Oct. 29, 2004, titled, "Method and System for Glitch-Free Differential Current Steering Switch Circuit For High Speed, High Resolution Digital-to-Analog Conversion," which is incorporated herein by reference in its entirety.

BACKGROUND OF THE INVENTION

1. Field of the Invention

The present invention generally relates to the field of current steering switch circuits for high speed and high resolution Digital/Analog conversion.

2. Background Art

Current steering switch circuits, are widely used in high speed Nyquist Digital/Analog converters (DACs). Noises or glitches arise at the switch circuit output during switching actions. The noises or glitches are due in part to feed-through of the switching input signal to the output, across the parasitic capacitance that exists between the input and output nodes. The noises and glitches are also due to unbalanced currents that are injected to the differential output nodes from the bouncing common emitter node of the switching differential pair.

The former is known in the art as type-I switching noise and the latter type-II switching noise. The DAC output noise arising from the switching action is linear if the DAC is fully segmented, where the DAC output signal level is proportional to: the total number of differential pairs that switch their unary tail currents to the positive side of the DAC differential output, minus the number of those that switch to the negative side.

However, for 10-bit or higher resolutions, a segmented DAC architecture that includes an array of switched unary current sources and an array of switched binary weighted current sources is usually used to suppress the complexity. As a result, the net number of differential pairs that switch their tail currents to the positive side of the DAC differential output is not a linear function of the signal level; and therefore, the switching noise causes nonlinear error at the DAC output even if it is identical in magnitude for each switching action.

As the conversion rate increases, the switching time becomes a considerable portion of each conversion cycle and the switching noises may thus dominate the output nonlinearity and thus limit the conversion rate of high resolution DACs.

For example, in cable modem headend applications, it is desirable to run an array of 12-bit (or higher resolution) DACs at approximately 2.5 Giga-Sample/second (GS/s) to send multiple channel signals in each DAC. The conversion cycle is 400 pico-seconds (ps), while the differential pair switching time in the current bipolar complimentary metal oxide semiconductor (BiCMOS) technology is about 40 ps. Thus, the switching noises could represent as much as one tenth of a DAC output waveform. Simulations illustrate that the switching noises limit the spurious-free dynamic range (SFDR) of the DAC output to below 60 dB.

What is needed, therefore, are techniques to suppress the switching noises to impove the SFDR beyond 60 dB

BRIEF SUMMARY OF THE INVENTION

Consistent with the principles of the present invention, as embodied and broadly described herein, the present invention includes a current steering circuit that can be used to build high-speed and high-resolution digital-to-analog converters. The current steering circuit includes a main differential pair switch coupled to a first tail current having a first current value. Also included is an auxiliary differential pair switch cross-connected to the main differential pair switch. The auxiliary differential pair switch is coupled to a second tail current and configured to substantially reduce a feed-through current associated with the main differential pair switch.

Further features and advantages of the present invention as well as the structure and operation of various embodiments of the present invention, as described in detail below with reference to the accompanying drawings.

BRIEF DESCRIPTION OF THE
DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE
INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

Figure 1:
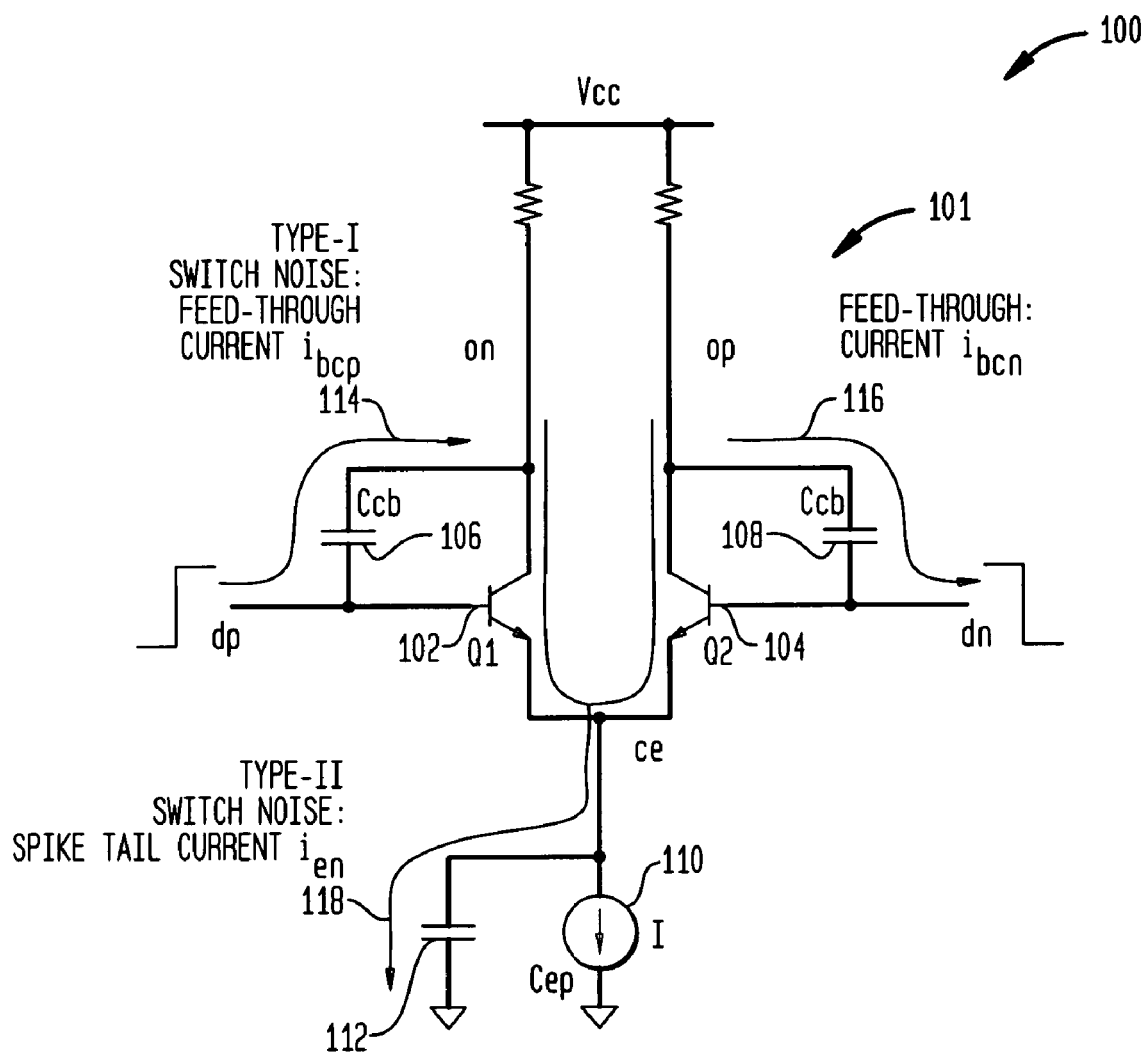
FIG. 1 is a schematic diagram illustrating the type-I and type-II switching noise currents in a differential switching circuit.

FIG. 1 is a schematic diagram of a portion 100 of a differential amplifier circuit including a current-steering switch 101. The switch circuit 101 includes a differential pair (diffpair) of first and second bipolar transistors 102 and 104, respectively, having differential negative and positive output nodes (on) and (op), respectively. The bipolar transistors 102 and 104 include respective (parasitic) junction capacitors 106 and 108 explicitly illustrated between their base and collector. The junction capacitors 106 and 108 are representative of the total input-output Miller capacitance. Also included in the main switch 101 is a current source 110 and an associated parasitic capacitance represented by a capacitor 112. The differential transistors 102 and 104 and the current source 110 form the main switch 101. For purposes of illustration, the current source 110 produces an exemplary current value of 1.5I Discharge and charge of the junction capacitors 106 and 108 occurs when the differential input nodes (dp) and (dn) switch between a constant high voltage and constant low voltage. The switching produces a type-I switching noise in the form of feed-through currents 114 and 116, respectively. A type-II switching noise is created across the capacitor 112 in the form of a current 118 when the voltage at the common emitter node (ce) bounces as a result of the voltage switching at the input nodes (dp) and (dn). As noted above, the type-I and type-II switching noises could cause relatively significant DAC output nonlinearity.

Figure 9:
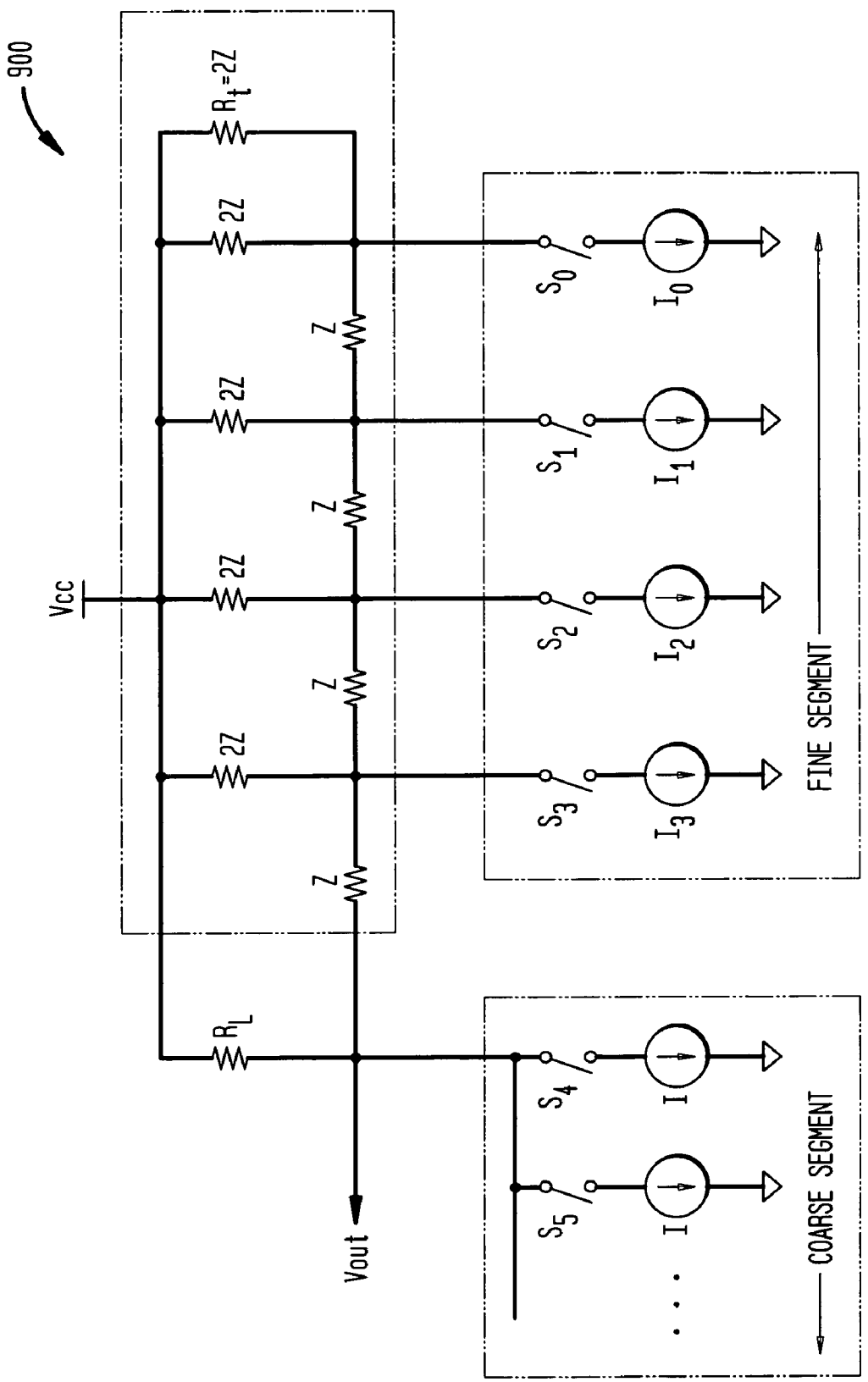
FIG. 9 is a schematic diagram of a DAC 900 including switches $S_0$ through $S_5$.

For example, FIG. 9 is a schematic diagram of a DAC 900 including switches $S_0$ through $S_5$. One or more of switches $S_0$ through $S_5$ can be implemented with the switch 101 (FIG. 1). In the example of FIG. 9, switches $S_0$ through $S_3$ perform fine granularity digital-to-analog conversion. Switches $S_4$ and $S_5$ perform coarse digital-to-analog conversion. Operation of the DAC 900 is described in co-pending U.S. patent application Ser. No. 11/080,808, titled, "Delay Equalized Z/2Z Ladder for Digital to Analog Conversion," filed Mar. 16, 2005, and incorporated herein by reference in its entirety. The switches $S_0$ through $S_5$ do not necessarily have the same weighting. As a result, the type-I and type-II switching noises from the different switches could cause relatively significant DAC output nonlinearity.

Figure 2:
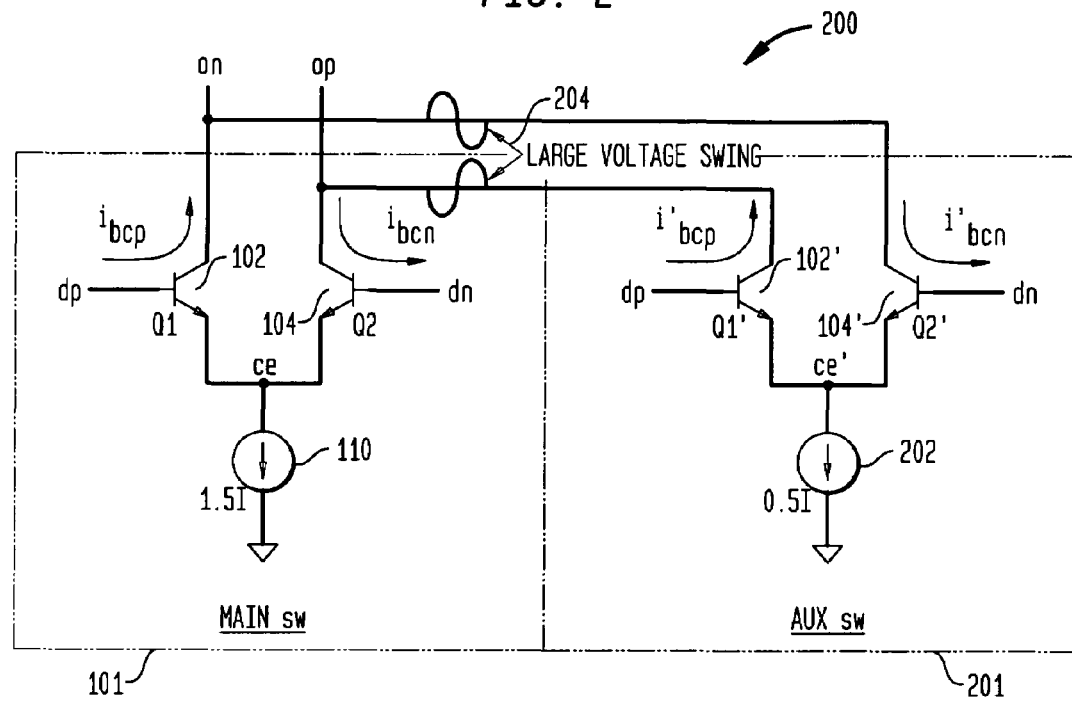
FIG. 2 is a schematic diagram of a balanced switch that cancels type-I noise currents.

FIG. 2 is a schematic diagram of an exemplary balanced switch 200, that substantially reduces the type-I and type-II noises.

The balanced switch 200 includes the main switch 101 from FIG. 1, and an auxiliary balanced switch 201 that substantially cancels the current feed-through (type-I switching noise) from the main switch 101. The auxiliary balanced switch 201 includes differential pair transistors 102' and 104' and is substantially similar to the main switch 101 in size. The auxiliary switch 201 is biased with a current source 202 having a lower exemplary current value (e.g., 0.5I) than the exemplary 1.5I value of the current source 110. The differential output nodes of the auxiliary balanced switch 201 are cross-connected to the output of the main switch 101. Within the circuit 200, input feed-through currents $I'_{bcp}$ and $I'_{bcn}$ substantially cancel input feed-through currents $I_{bcp}$ and $I_{bcn}$ (type-I noise) to $1^{st}$ order in the main switch 101.

The spike tail currents (type-II noise) also partially cancel at the differential output nodes (op) and (on) of the main switch 101. The cancellation is not differentially complete due to the mismatch between the parasitic capacitors at the two common emitter nodes (ce) and (ce'). The unequal tail current sources (e.g., 1.5I vs 0.5I as shown in FIG. 2) in the main and auxiliary switches contribute mismatched parasitics.

The main switch 101 and auxiliary switch 201 are substantially identical except for a smaller tail current bias within the auxiliary switch 201. That is, since the auxiliary switch 201 is cross-connected to the main switch 101, the contributions including the noises of the auxiliary switch 201 to the differential output are reversed from those of the main switch 101. Since the bias current has less impact on the input-output parasitic capacitance, especially if the differential pairs are metal-oxide-silicon field effect devices (MOSFETs), the type-I feed-through noise cancels more than the signal and, subsequently, increases the SNR and SFDR.

With regard to the balanced switch 200, input data serializers and retiming devices, that may precede the array of current steering switches within high speed DACs, dominate the power and area consumption. Though the balanced switch consumes approximately twice as much current as the conventional switch (1.5I+0.5I=2I vs. I), the incremental contribution to the overall power dissipation is relatively marginal. In fact, simulations show this balanced switch technique can improve the DAC output SFDR by 10 dB or more with only ~10% increase in the total power dissipation.

Figure 3:
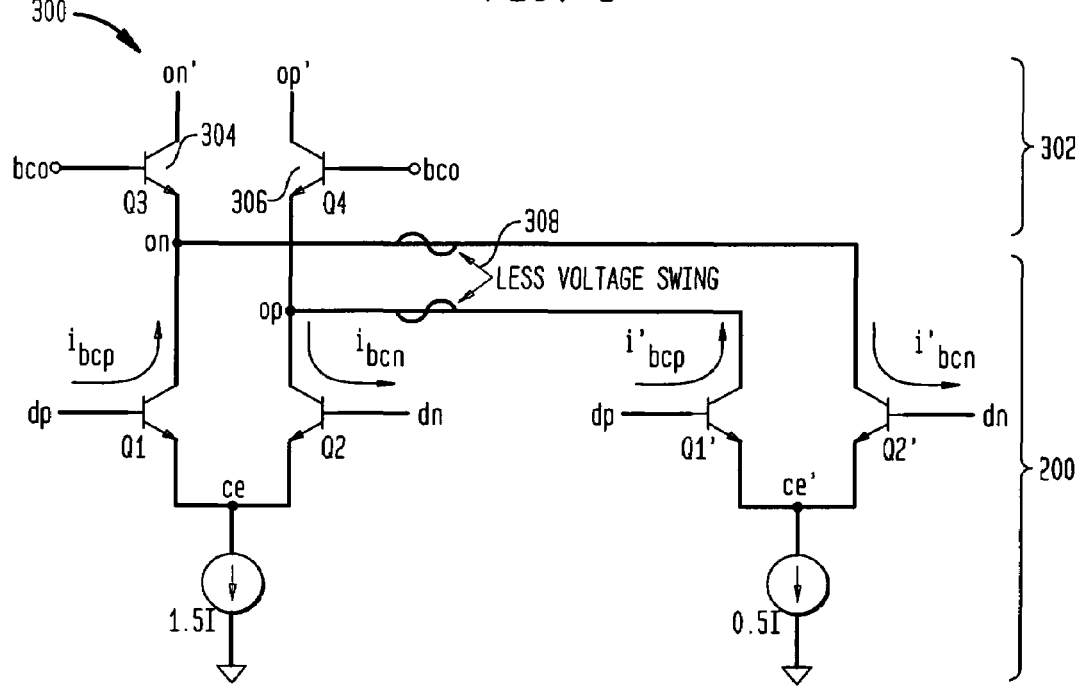
FIG. 3 is a schematic diagram of a balanced switch with output cascode devices to improve type-I noise cancellation.

FIG. 3 is a schematic diagram of a balanced switch 300 including a pair 302 of output cascode devices 304 and 306 coupled to the balanced switch 200 of FIG. 2. In FIG. 3, the output cascode transistors 304 and 306 reduce the Miller effect (i.e. effectively larger input-output capacitance seen at the input due to the output varying in the opposite phase of the input signal) and further reduce unbalanced feed-through by regulating voltages at the output nodes (op) and (on) of the balanced switch 200.

A constant voltage produced by an external source is applied to the shorted base terminals (bco) of the cascode transistors 304 and 306. In this manner, the cascode transistors 304 and 306 behave as a shielding device reducing the degree of swing at the output of the balanced switch 206 from a relatively large swing 204 (FIG. 2) to a smaller voltage swing 308. As a result, the parasitic junction capacitances between the input and output nodes experiences less variation during switching. Thus, an improvement in the cancellation among the feed-through noise currents $I_{bcp}$, $I_{bcn}$, $I'_{bcp}$, and $I'_{bcn}$ is realized since these currents are closer in magnitude. As a result, simulations show the cascode transistor and balanced switch combination of FIG. 3 improves SFDR by 20 dB over the separate use of either output cascode devices or the balanced switch 200.

Figure 4:
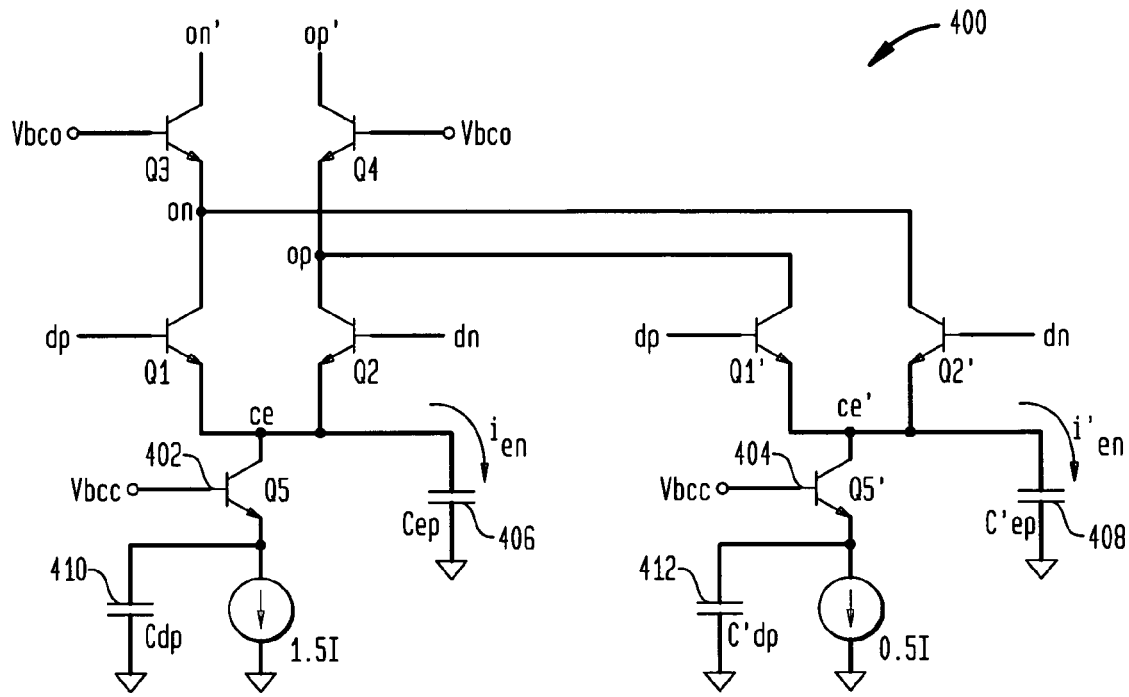
FIG. 4 is a schematic diagram of a balanced switch with tail current cascode transistors configured to suppress type II noise currents.

FIG. 4 is a schematic diagram of a balanced switch 400, including the balanced switch 300 and cascode transistors 402 and 404, configured to suppress type II noise. In layout, the cascode transistors 402 and 404 are placed close to the respective switching differential pairs within the balanced switch 200 to shield the relatively large parasitic capacitances 410 and 412 from the noisy common emitter nodes (ce) and (ce'). Since the noisy nodes (ce) and (ce') now see relatively much less parasitics 406 and 408, respectively, the type-II spike currents are significantly reduced.

Figure 5:
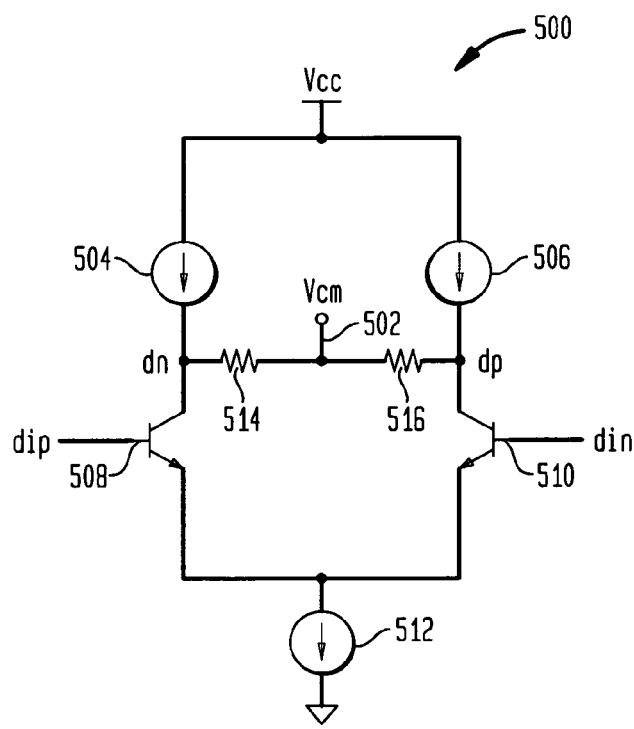
FIG. 5 is a schematic diagram of a differential amplifier circuit 500 used to drive the balanced switch input.

FIG. 5 is a schematic diagram of an example differential amplifier circuit 500 used to drive the input differential pairs of the switch circuits associated with the embodiment of FIGS. 2–4. In FIG. 5, the output common mode 502 of the driver amplifier is set to a reference voltage Vcm, which is AC referenced to ground, for an improved power supply rejection ratio (PSRR). The amplifier circuit 500 includes first and second current sources 504 and 506, first and second transistors 508 and 510, first and second resistors 514 and 516, and a third current source 512.

Figure 6:
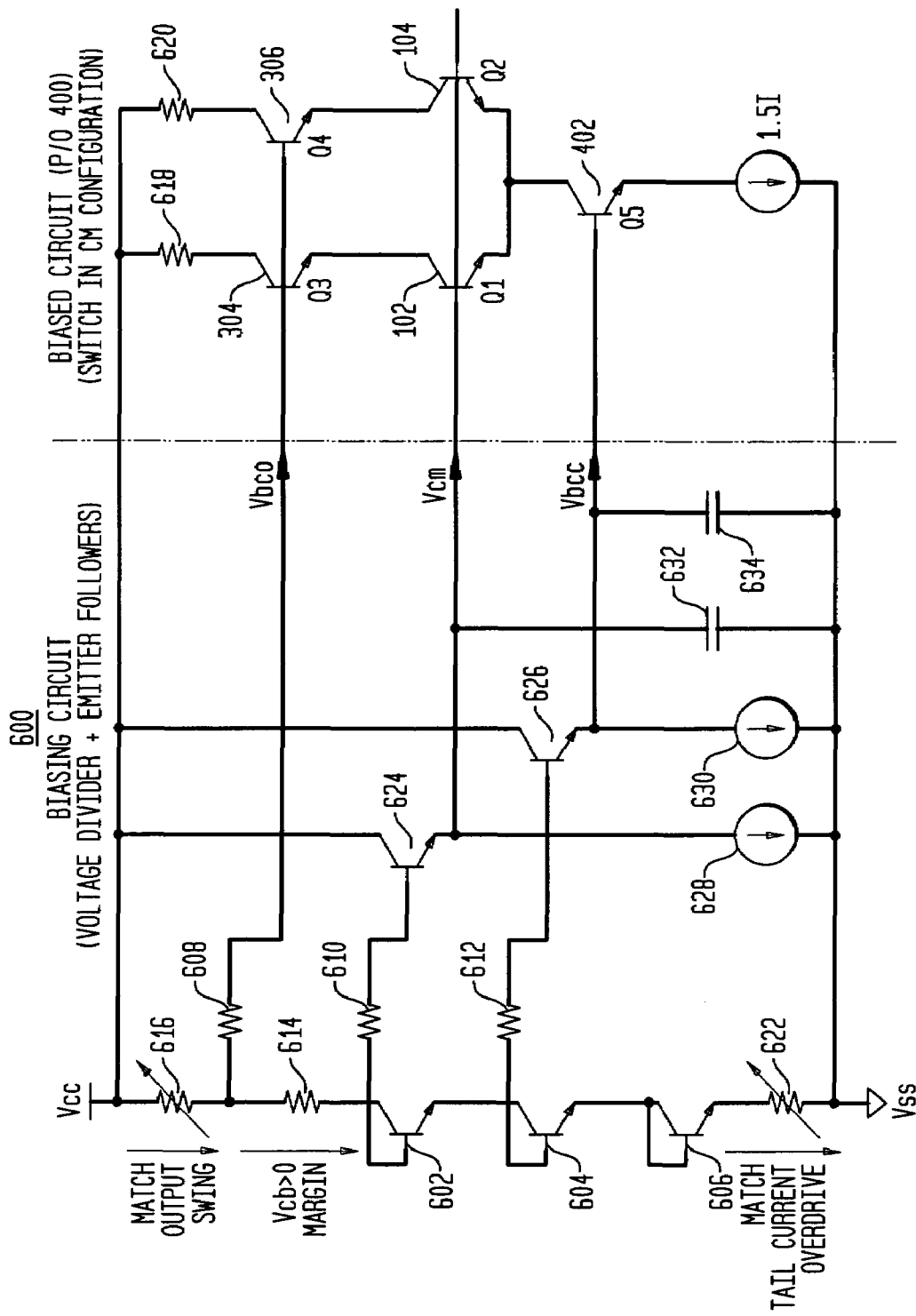
FIG. 6 is a schematic diagram of a voltage divider circuit generating the bias voltages for the balanced switch circuit.

FIG. 6 is a schematic diagram of an example biasing circuit 600 coupled to the balanced switch 400. In the example of FIG. 6, only a portion of the balanced switch 400 is illustrated for convenience. In FIG. 6, the cascode transistors 304 and 306 and the switching input differential pairs 102 and 104 are biased using a voltage divider scheme that includes three diode connected transistors 602, 604, and 606 and three resistors 616, 614, and 622, connected in series between power supply Vcc and ground. The reference voltages generated from the voltage divider are filtered with a RC circuit and buffered from the noisy switches through emitter followers (transistors 624 and 626).

In the voltage divider, resistor 616 connected to Vcc matches, in terms of voltage drop, the load resistors 618 and 620 driven by the switch 400. Resistor 616 can be adjusted to adjust the output swing.

The first transistor 602, from Vcc down to ground, matches the switch output cascode transistors 304 and 306. The second transistor 604 matches the input differential pair of transistors 102 and 104. The third transistor 606 matches the tail current cascode transistor 402. The resistor 622, connected to ground, matches the resistor 616 in type, and its voltage drop provides the voltage headroom for the tail current sources 110 and 202 in the balanced switch. Resistor 622 can be adjusted to accommodate different current sources 110 and 202. Due to the matching between the reference generator and the biased switches, the operating points track each other and thus the circuit tolerates larger variation in process, supply voltage and temperature (PVT).

In FIG. 6, a relatively small resistor 614 can be inserted in the voltage divider to give some voltage headroom (i.e., Vcb>0) to the input differential pairs 102 and 104. Since the voltage drop of the resistor 616 and resistor 622 is determined by the DAC output swing and the head room for the tail current sources, respectively, the ratio of these two resistors can be programmed in accordance to the output voltage swing and/or required current source headroom.

Figure 7:
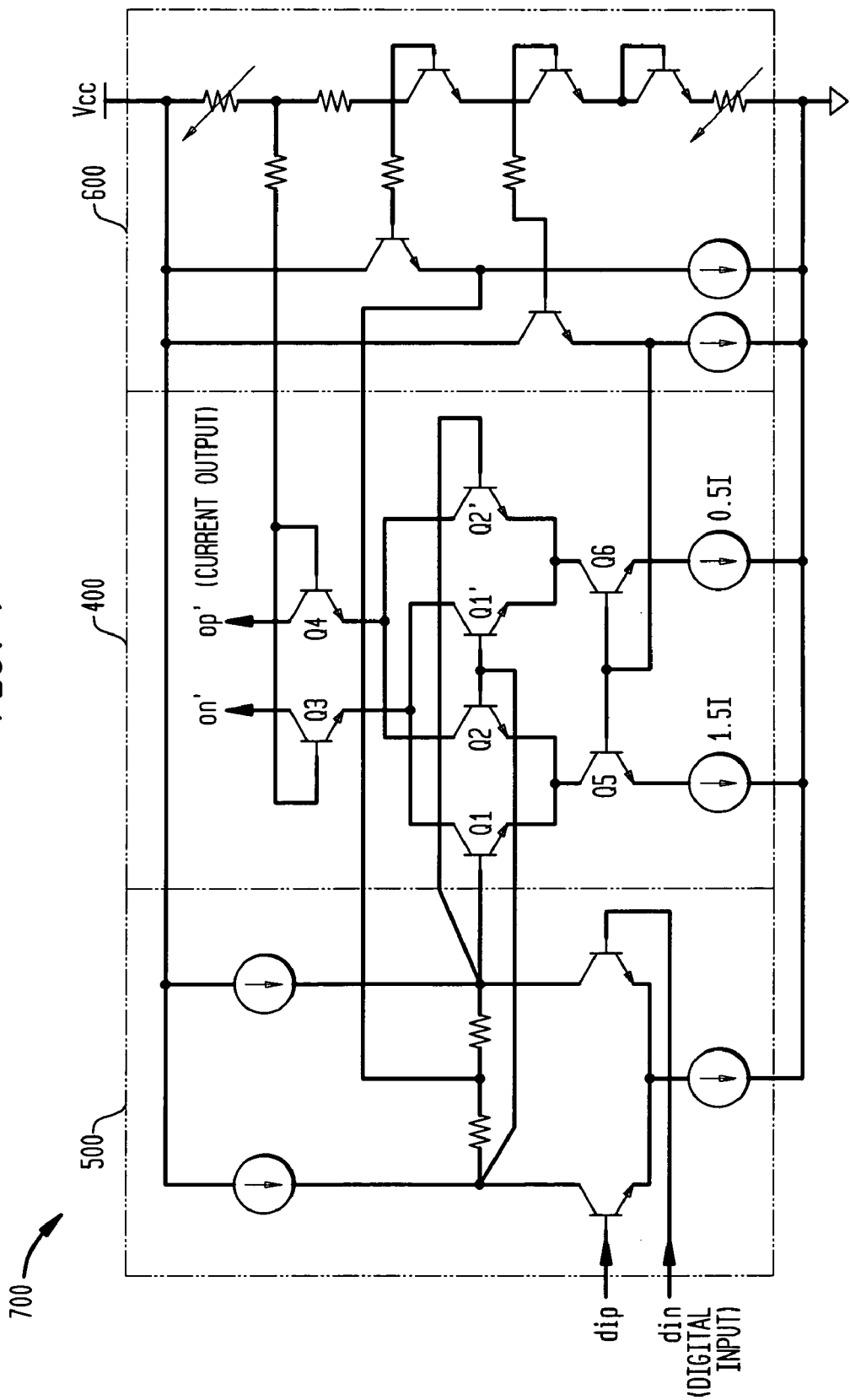
FIG. 7 is a schematic diagram of the balanced switch circuit configured with the driver stage and biasing circuits.

Features described herein can be implemented alone and or in various combinations with one another. For example, and without limitation, FIG. 7 is a schematic diagram of a balanced switch 700 including a combination of features described herein. The invention is not, however, limited to the example of FIG. 7. In the example of FIG. 7, the balanced switch 700 includes the balanced switch 400 (FIG. 4), the differential amplifier circuit 500 (FIG. 5), and the switch circuit biasing circuit 600 (FIG. 6). In an embodiment, the transistors Q1, Q2, Q1' and Q2' are substantially the same size, Q3 and Q4 are substantially the same size, and Q5 and Q6 are substantially the same size.

Figure 8:
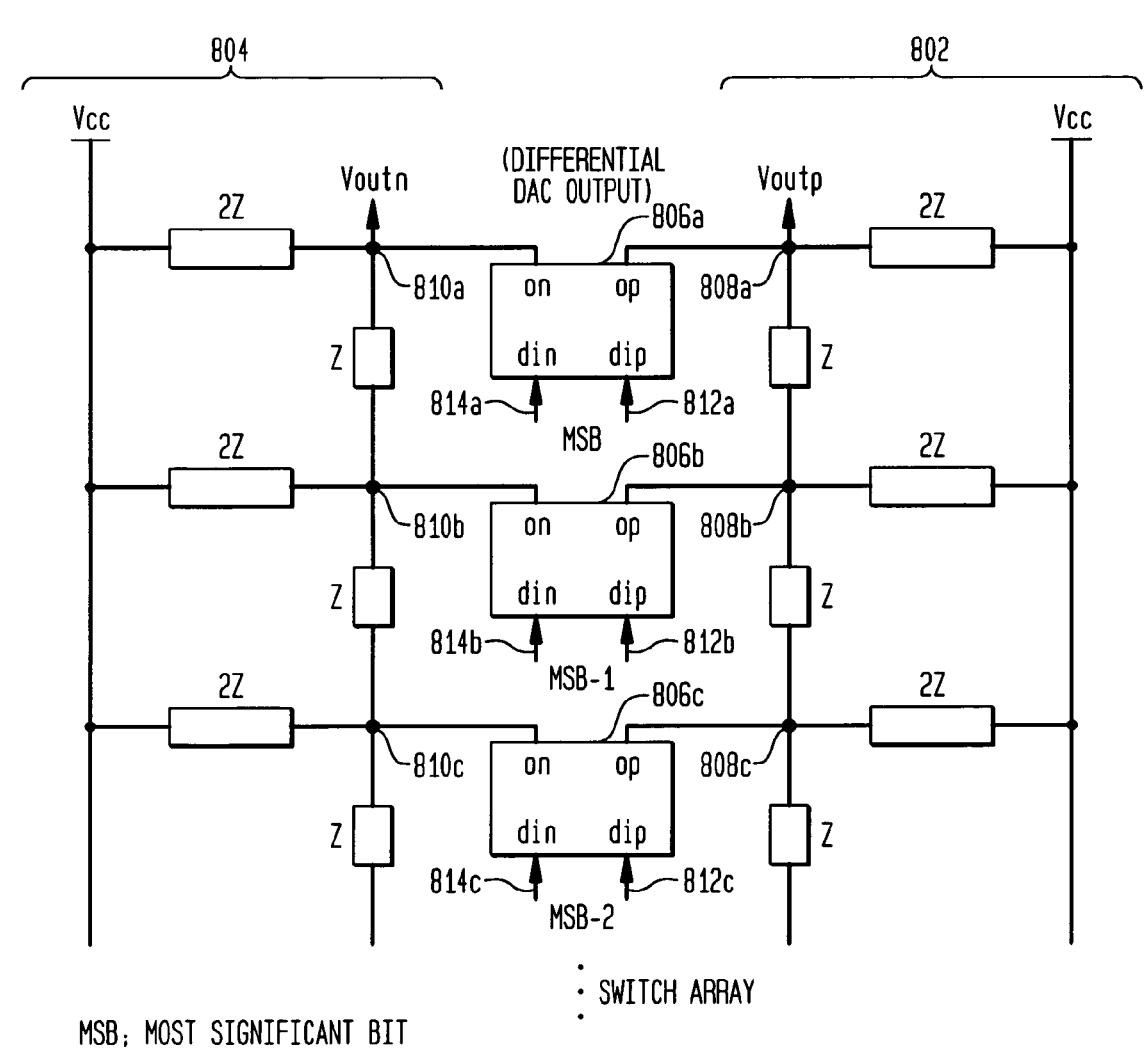
FIG. 8 is a block diagram of digital-to-analog converter ("DAC") 800, including a Z/2Z ladder.

The balanced switches disclosed herein can be implemented within a DAC R/2R ladder network, a Z/2Z ladder network, and/or a Z/kZ ladder network, as described in co-pending application Ser. No. 11/080,808, discussed and incorporated by reference above. For example, and without limitation, FIG. 8 is a block diagram of a DAC 800, including a P-type ladder 802 and an N-type ladder 804. Differential switches 806 couple respective nodes 808 and 810 to a current source (not shown in FIG. 8) under control of respective differential data control lines 812 and 814. The differential switches 806 are implemented as described herein.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What is claimed is:

1. A current-steering switch circuit, comprising:
a main differential pair switch including a first transistor pair having respective first and second control nodes, first and second output nodes, and a tail current node;
an auxiliary differential pair switch including a second transistor pair having respective first and second control nodes, first and second output nodes, and a tail current node;
wherein the first and second control nodes of the main differential pair switch are coupled to the first and second control nodes, respectively, of the auxiliary differential pair switch;
wherein the first and second output nodes of the main differential pair switch are cross-coupled to the second and first output nodes, respectively, of the auxiliary differential pair switch;
whereby the first output node of the main differential pair switch and the second output node of the auxiliary differential pair switch form a first coupling node;
whereby the second output node of the main differential pair switch and the first output node of the auxiliary differential pair switch form a second coupling node;
a first tail current source, having a first current value, coupled to the main differential pair switch tail current node;
a second tail current source, having a second current value that is lower than the first current value, coupled to the auxiliary differential pair switch tail current node; and
a pair of cascode transistors coupled to the first and second coupling nodes, respectively, whereby the pair of cascode transistors regulate a voltage at the coupling nodes.

2. The current-steering switch circuit of claim 1, further comprising a second pair of cascode transistors, one transistor of the second pair being coupled between the main differential pair switch tail current node and the first tail current source, the other transistor of the second pair being coupled between the auxiliary differential pair switch tail current node and the second tail current source.

3. The current-steering switch circuit of claim 2, further comprising:
a differential amplifier circuit coupled to the control nodes of the main differential pair switch and the auxiliary differential pair switch, the differential amplifier circuit including input terminals to receive a differential input signal; and
a biasing circuit that biases the main differential pair switch, the auxiliary differential pair switch, and the first and second pairs of cascode transistors, as functions of a supply voltage.

4. The current-steering switch circuit of claim 3, wherein the biasing circuit comprises:
a first transistor (602) that matches the first pair of cascode transistors (304, 306);

a second transistor (604), coupled to the biasing circuit first transistor, that matches the main differential pair switch (102, 104); and a third transistor (606), coupled to the biasing circuit second transistor, that matches the second pair of cascode transisors (402, 404).

5. The current-steering switch circuit of claim 4, wherein the biasing circuit further comprises:

a first resistance (616) coupled between the biasing circuit first transistor and the supply voltage, that matches load resistances coupled between the first pair of cascode transistors and the supply voltage, wherein the first resistance controls a voltage swing of the load resistance; and a second resistance (622), coupled between the biasing circuit third transistor and a second power supply, that provides voltage headroom for the first and second tail current sources (110 and 202), wherein the biasing circuit second resistance is adjustable to accommodate different current sources.

6. The current-steering switch circuit of claim 5, wherein the biasing circuit further comprises a third resistance (614) coupled between the biasing circuit first resistance (616) and the biasing circuit first transistor (602), that provides a margin of operation for the main differential pair switch.

7. The current-steering switch circuit of claim 3, wherein the differential amplifier circuit comprises a differential pair of driver transistors, the driver transistors including respective control terminals that function as the input terminals, each driver transistor including a second terminal coupled to the supply voltage through respective current sources, wherein the first terminals are coupled to one another through a series of resistors defining a common mode voltage node there between, each driver transistor including a third terminal coupled to a third current source, wherein the common mode voltage node is biased by the bias circuit.

8. The current-steering switch circuit of claim 1, wherein the main differential pair switch and the auxiliary differential pair switch form a balanced switch.

9. The current-steering switch circuit of claim 1, wherein the auxiliary differential pair switch is substantially identical to the main differential pair switch.

10. The current-steering switch circuit of claim 1, wherein the transistors are implemented with bi-polar devices.

11. The current-steering switch circuit of claim 1, wherein the transistors are implemented in complimentary metal oxide semi-conductor material.

12. A digital-to-analog converter, comprising:

an n-type Z/kZ ladder;

a p-type Z/kZ ladder; and an array of differential switches coupled between the n-type Z/kZ ladder and the p-type Z/kZ ladder, wherein at least one of the differential switches includes;

a main differential pair switch including a first transistor pair having respective first and second control nodes, first and second output nodes, and a tail current node;

an auxiliary differential pair switch including a second transistor pair having respective first and second control nodes, first and second output nodes, and a tail current node;

wherein the first and second control nodes of the main differential pair switch are coupled to the first and second control nodes, respectively, of the auxiliary differential pair switch;

wherein the first and second output nodes of the main differential pair switch are cross-coupled to the second and first output nodes, respectively, of the auxiliary differential pair switch;

whereby the first output node of the main differential pair switch and the second output node of the auxiliary differential pair switch form a first coupling node;

whereby the second output node of the main differential pair switch and the first output node of the auxiliary differential pair switch form a second coupling node;

a first tail current source, having a first current value, coupled to the main differential pair switch tail current node;

a second tail current source, having a second current value that is lower than the first current value, coupled to the auxiliary differential pair switch tail current node; and a pair of cascode transistors coupled to the first and second coupling nodes, respectively, whereby the pair of cascode transistors regulate a voltage at the coupling nodes.

13. The digital-to-analog converter of claim 12, further comprising a second pair of cascode transistors, one transistor of the second pair being coupled between the main differential pair switch tail current node and the first tail current source, the other transistor of the second pair being coupled between the auxiliary differential pair switch tail current node and the second tail current source.

14. The current-steering switch circuit of claim 13, further comprising:

a differential amplifier circuit coupled to the control nodes of the main differential pair switch and the auxiliary differential pair switch, the differential amplifier circuit including input terminals to receive a differential input signal; and a biasing circuit that biases the main differential pair switch, the auxiliary differential pair switch, and the first and second pairs of cascode transistors, as functions of a supply voltage.

15. The current-steering switch circuit of claim 14, wherein the biasing circuit comprises a series of voltage dividers coupled between the supply voltage and a reference terminal.

16. The current-steering switch circuit of claim 15, wherein the differential amplifier circuit comprises a differential pair of driver transistors, the driver transistors including respective control terminals that function as the input terminals, each driver transistor including a second terminal coupled to the supply voltage through respective current sources, wherein the first terminals are coupled to one another through a series of resistors defining a common mode voltage node there between, each driver transistor including a third terminal coupled to a third current source, wherein the common mode voltage node is biased by the bias circuit.

17. The current-steering switch circuit of claim 12, wherein the main differential pair switch and the auxiliary differential pair switch form a balanced switch.

18. The current-steering switch circuit of claim 12, wherein the auxiliary differential pair switch is substantially identical to the main differential pair switch.

19. The current-steering switch circuit of claim 12, wherein the at least one of the differential switches is implemented with bi-polar devices.

20. The current-steering switch circuit of claim 12, wherein the at least one of the differential switches is in a complimentary metal oxide semi-conductor material.

* * * * *